United States Patent [19]

Long

[11] Patent Number: 5,210,440
[45] Date of Patent: May 11, 1993

[54] SEMICONDUCTOR CHIP COOLING APPARATUS

[75] Inventor: Jon M. Long, Livermore, Calif.

[73] Assignee: VLSI Technology, Inc., San Jose, Calif.

[21] Appl. No.: 710,740

[22] Filed: Jun. 3, 1991

[51] Int. Cl.⁵ .............. H01L 25/04; H01L 23/48
[52] U.S. Cl. ................... 257/675; 257/714; 257/719; 361/385; 361/388
[58] Field of Search ............ 357/81, 82, 74, 70, 357/80; 361/388, 385, 382, 389

[56] References Cited

U.S. PATENT DOCUMENTS

| | | | |
|---|---|---|---|
| 3,365,620 | 1/1968 | Butler et al. | 357/82 |
| 3,706,010 | 12/1972 | Laermer et al. | 357/82 |
| 4,186,422 | 1/1980 | Laermer | 361/388 |
| 4,547,834 | 10/1985 | Dumont et al. | 361/386 |
| 4,748,495 | 5/1988 | Kucharek | 357/82 |
| 5,031,025 | 7/1991 | Braun et al. | 357/74 |
| 5,053,853 | 10/1991 | Haj-Ali-Ahmadi et al. | 357/74 |
| 5,065,279 | 11/1991 | Lazenby et al. | 357/81 |

FOREIGN PATENT DOCUMENTS 2266427 10/1975 Fed. Rep. of Germany .

Primary Examiner—Rolf Hille
Assistant Examiner—David Ostrowski
Attorney, Agent, or Firm—Majestic, Parsons, Siebert & Hsue

[57] ABSTRACT

A novel semiconductor chip cooling apparatus includes at least one semiconductor die packaged according to a TAB design. A support structure supports the die, and a dike is connected to the support structure and the TAB tape to form a cavity impervious to liquid and air. Input and output means are connected to the cavity. Fluid means circulate throughout the cavity and utilize the input and output means to directly cool the die during operation of the semiconductor die. Heat spreading means may be positioned below the die to increase the amount of surface area which contacts the fluid means, thereby cooling the die more efficiently.

16 Claims, 3 Drawing Sheets

SEMICONDUCTOR CHIP COOLING APPARATUS

BACKGROUND OF THE INVENTION

This invention relates to a novel apparatus for cooling a semiconductor die. More specifically, this invention relates to an apparatus for cooling an integrated-circuit chip by circulating a cooling liquid around the chip.

In the design of optimal computer systems, it is important that the most number of integrated circuit chips are fit into the least amount of space. Integrated circuit technology has advanced so that extremely small chips can be produced which have significantly more computing power than in previous years. Chip packaging design is also an important factor affecting the size of the computer circuitry. While there are a number of advantages to decreasing the size of semiconductor chips, associated problems have also arisen. For instance, as the chip size decreases, the heat emitted from the chip becomes problematic because it is difficult to cool such a small element. The chip packaging design also affects how efficiently the chip may be cooled. As the chip temperature increases, the effective operating speed of the chip decreases. Also, it is necessary to keep the chip below a certain temperature in order to prevent damage to the chip circuitry.

Semiconductor chips are often elements in complex systems which are built from a plurality of printed circuit boards, which are themselves interconnected by other printed circuit or mother boards. The resulting system is relatively bulky and yet compact. Since the systems are compact, effective cooling systems are needed to remove the heat which evolves during operation. Some cooling systems result in even bulkier packages which utilize valuable circuit board space.

In order to facilitate cooling, individual semiconductor chips and semiconductor chip systems have been designed to permit convection about and within them. The convection may be natural or forced, and air has been used as the cooling medium. Circulating air has helped to remove some of the heat emitted from a semiconductor chip, but it is oftentimes an undesirable means of doing so. Natural convection is not an efficient cooling method, and forced air convection has the disadvantage of polluting the circuits by rapidly covering them in dust.

Another method of cooling semiconductor chips is to circulate a liquid around a chip. A cooling liquid cools the chip more efficiently than air and obviates the problems associated with air convection. While the liquid cooling systems that have been developed are an improvement over air convection systems, a semiconductor die sometimes remains at an undesirable temperature because the circulating fluid cannot absorb enough heat to adequately cool the chip. More specifically, the fluid flow may not be evenly distributed around the chip. Additionally, temperature gradients may exist on the chip surface, thereby causing the chip to operate improperly.

Some prior art devices utilizing liquid for cooling have included complex structures which are difficult to fabricate. One type of arrangement, as shown in U.S. Pat. No. 4,547,834 to Dumont et al., includes a plurality of levels to support a semiconductor chip and permit cooling of the chip. Some of the levels are separated to form an opening through which the liquid circulates to cool the semiconductor die. A plurality of column supporters hold up a layer of metal under which the liquid circulates. This arrangement is unsatisfactory because it is complex, expensive, and somewhat difficult to fabricate.

Semiconductor chip cooling arrangements must additionally take into account the type of die packaging. For example, the die may be packaged utilizing a common packaging design called tape automated bonding (TAB). TAB, a replacement for wire bonding, utilizes a tape having leads fabricated on its surface. The tape is connected to the die so that the leads may be bonded to the appropriate die surfaces. TAB is a useful packaging method because it is simple and reliable.

Another cooling package is described in U.S. Pat. No. 4,748,495 to Kucharek, and includes a structure having a coolant path through a heat sink. The heat sink is adjacent to a heat spreader, which is adjacent to the top surface of an IC chip. Heat emitted from the IC chip is transferred to the heat sink via the heat spreader by means of a cooling liquid. The heat sink structure is somewhat complex and includes a plurality of parallel channels through which the liquid flows. Kucharek mentions that the structure may be adaptable for chips having tape automated bonded (TAB) contacts. While the package reduces the temperature of the IC chip more than air convection units, the complexity and accompanying cost of the unit are undesirable. Additionally, the package is bulky and takes up valuable circuit-board space. Other types of packaging arrangements include similarly complex designs which are expensive to fabricate.

The difficulties suggested in the preceding are not intended to be exhaustive, but rather are among many which may tend to reduce the usefulness of prior semiconductor chip cooling apparati. Other noteworthy problems may also exist; however, those presented above should be sufficient to demonstrate that semiconductor chip cooling apparati in the past will admit to worthwhile improvement.

It is therefore a general object of the invention to provide a novel semiconductor chip cooling apparatus which will obviate or minimize difficulties of the type previously described.

It is a specific object of the invention to provide a semiconductor chip cooling apparatus which will efficiently cool a semiconductor chip.

It is another object of the invention to provide an apparatus for cooling a semiconductor chip which is packaged using tape automated bonding (TAB) techniques.

It is still another object of the invention to provide a semiconductor chip cooling apparatus which is compact.

It is yet another object of the invention to provide a semiconductor chip cooling apparatus which is relatively simple to manufacture, inexpensive, and reliable.

SUMMARY OF THE INVENTION

The present invention is directed to an integrated-circuit cooling apparatus which includes at least one semiconductor die having bond pads and being connected to a tape having leads. The tape is positioned next to the die to permit electrical connections between the leads and the bond pads. The apparatus includes a support structure having a surface for supporting the die, and a dike connected to the surface and the tape. The dike surrounds the die to form, with the tape and the surface, a cavity impervious to air or liquid. An input means and outputs means are connected to the cavity. Fluid means utilize the input means and output means to circulate throughout the cavity and reduce the temperature of the die and the support structure by directly contacting at least a portion of each of them.

DESCRIPTION OF THE DRAWINGS

Other advantages of the present invention will become apparent from the following detailed description of a preferred embodiment thereof, taken in conjunction with the accompanying drawings, wherein.

DETAILED DESCRIPTION OF THE INVENTION

Figure 1:
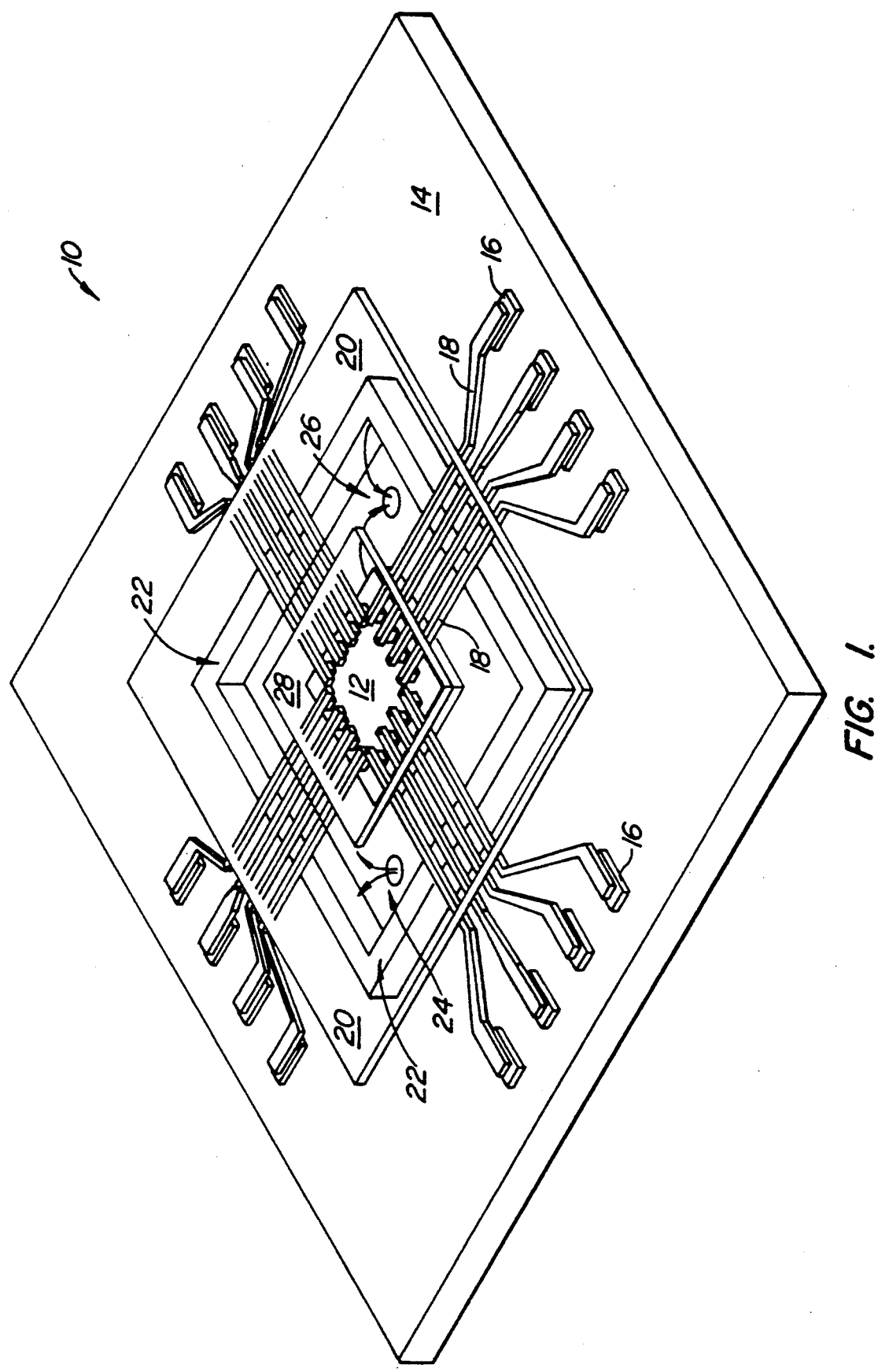
FIG. 1 is an axonometric view of the integrated-circuit dynamic cooling apparatus of the present invention.

Referring now to the drawings, wherein like numerals indicate like parts, and initially to FIG. 1, there will be seen an integrated-circuit cooling apparatus 10 which includes a semiconductor die 12 packaged according to a tape automated bonding (TAB) design. The die 12 rests upon a printed circuit board 14 having a plurality of bond pads 16. The die 12 is electrically connected to the printed circuit board 14 via leads 18 which are fabricated on a TAB tape 20. A dike 22 is connected to the printed circuit board 14 and the TAB tape 20 to form a cavity, and surrounds the semiconductor die 12 as shown. The dike forms an impermeable barrier around the die 12 so that a cooling liquid (not visible) may be circulated around the die 12 to reduce its temperature. The cooling liquid enters the cavity through an input port 24 and exits the cavity through an exit port 26; both ports are within the perimeter of the dike 22. The TAB tape is sealed on its top by an encapsulant 28, making the cavity impervious to liquid or air.

Figure 2:
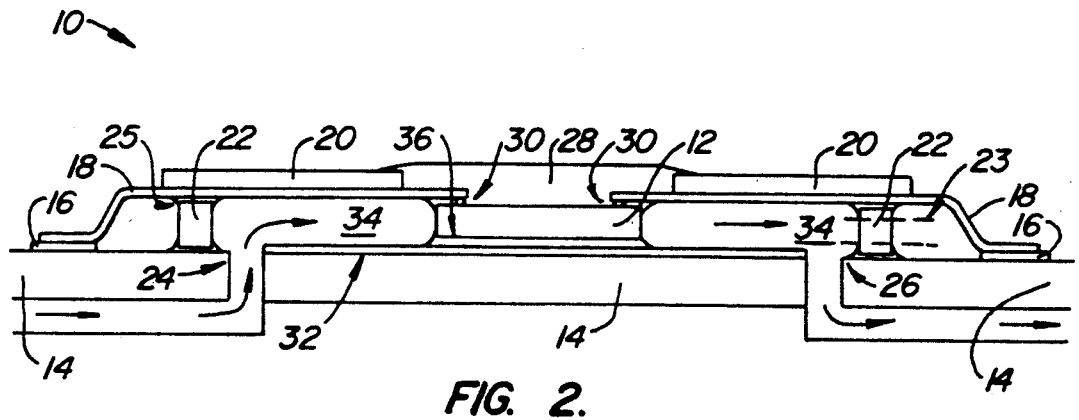
FIG. 2 is a side elevational view showing the integrated-circuit dynamic cooling apparatus of the present invention.

FIG. 2 shows a side elevational view of the instant invention and will facilitate an understanding of the compact design of the integrated-circuit cooling apparatus 10. More specifically, the die 12 includes bond pads 30 on its surface, each bond pad being connected to a lead 18, as shown. The leads 18 are attached to the TAB tape 20 and are positioned over the top side of the dike 22. The encapsulant 28 (shown by the shaded areas in FIG. 2) isolates the electrical connections at the bond pads 20 from the cooling liquid, which flows through cavity 34. The die 12 sits upon a heat spreader 32 which increases the heated surface area coming into contact with the cooling liquid and is attached to the printed circuit board 14 as shown. The heat spreader 32 is formed of a heat conducting material and is connected to the semiconductor die 12 by a heat conducting glue 36. Since the heat spreader sits adjacent to the semiconductor die 12, heat emitted from the die during its operation will transfer to the heat spreader 32. When the cooling liquid circulates, heat will be quickly transferred to and absorbed by the liquid because a large amount of heated surface area (i.e. the heat spreader) will contact the liquid. Additionally, the cooling liquid directly contacts the semiconductor die 12. Thus, the die will be cooled faster than prior art assemblies lacking a heat spreader 32.

The cooling liquid enters the cavity 34 through input port 24 which is coupled to an external fluid source, not shown. The fluid is circulated around the die 12 to absorb heat and exits the cavity 34 through the output port 26. The cooling liquid may be water, freon, other fluoroinerts, or any other suitable liquid. The temperature of the die will usually be less than 110° C. so that the cooling liquid will not vaporize. The dike 22 is formed out of a heat insulating material such as a plastic. The dike can also be formed out of metal, but plastic may be less expensive. The encapsulant 28 may be formed from a silicone based or other type of plastic. A flexible thermoplastic glue 25 secures the dike 22 to the TAB tape and maintains the cooling fluid integrity by permitting some amount of expansion within the cavity.

In an alternate embodiment, the dike 22 may include a bore 23 (indicated by dotted lines) therethrough, such that the cooling liquid is input to the cavity 34 through the bore. More specifically, input and output hoses (not shown) may be attached to the bore 23 and positioned at the corner of the die, as shown in dotted lines by the bore 23 in FIG. 4. This arrangement would obviate the need for the input port 24 and output port 26, as well as the portion of the cavity 34 below the printed circuit board 14. Inclusion of two bores 23 at opposite sides of the dike 22 might be useful in some applications of the integrated-circuit cooling apparatus 10, including those where optimal space utilization is not crucial. Another application might be one in which only a single die needs to be cooled.

Figure 3:
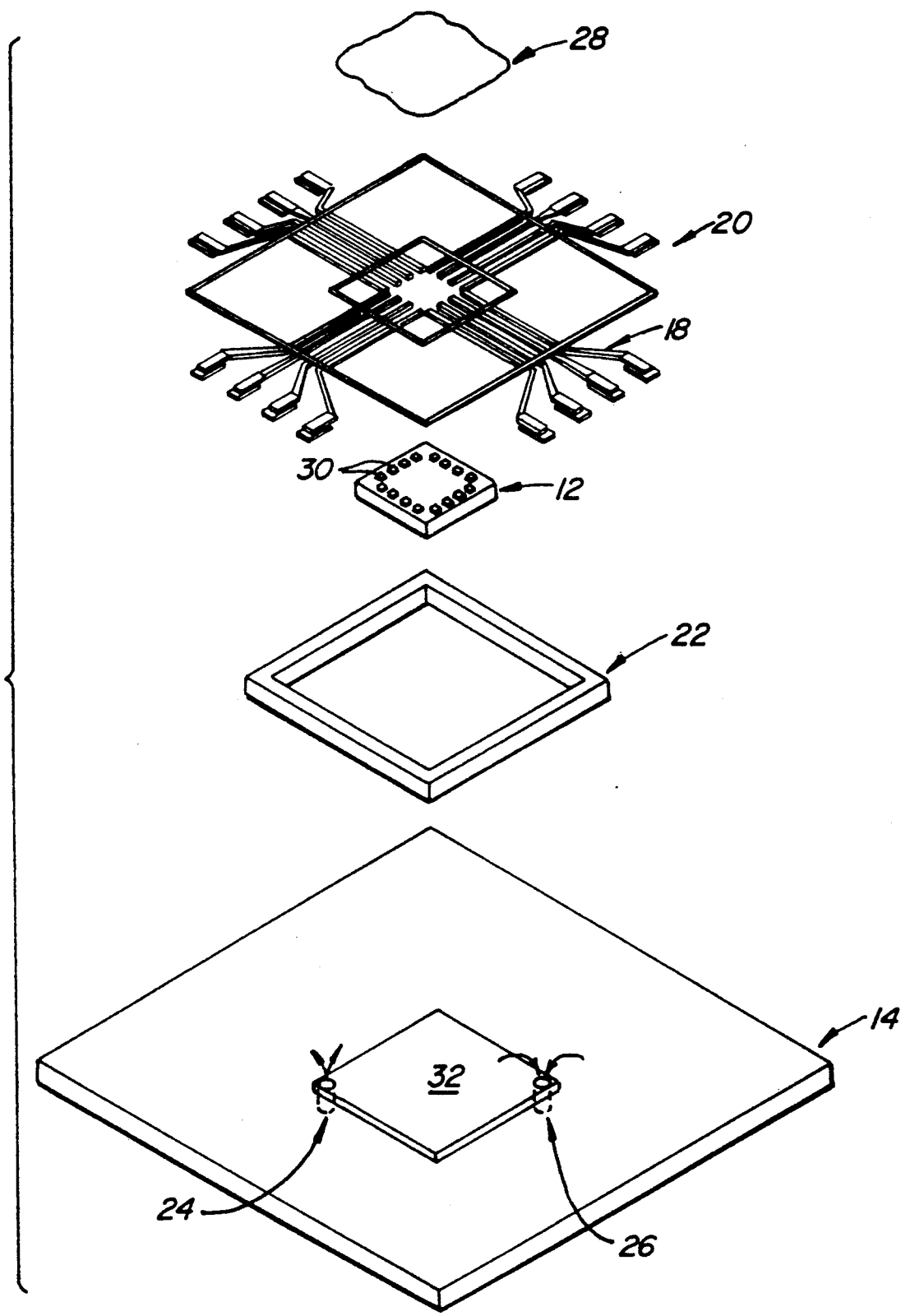
FIG. 3 is an exploded view of individual components of the subject invention prior to assembly.

FIG. 3 shows the components of the integrated-circuit cooling apparatus 10 prior to assembly. The fabrication process is relatively simple and inexpensive because the components may be easily glued together. The printed circuit board 14, which may be of a flexible material, is pre-fabricated to include the heat spreader 32, the input port 24 and the output port 26. The dike 22 is then glued to the circuit board so that the input/output ports and the heat spreader 32 are within the perimeter of the dike. Again, the heat spreader 32 is composed of a heat conducting material and the dike 22 is composed of a heat insulating material. The semiconductor die 12, having a plurality of bond pads 30 connected thereon, is glued to the center of the heat spreader 32. The TAB tape 20, which is usually prefabricated to include the encapsulant 28, is placed on top of the semiconductor die such that the leads 18 are adjacent to the corresponding bond pad 30 on the die 12. The leads 18 are bonded to the bond pads 16. Alternatively, the encapsulant 28 may be placed over the die 12 to form a closed cavity if the TAB tape is not prefabricated to include the encapsulant. A compression device heats the package surface and causes an adhesive on the surface of the dike 22 to bond to the leads 18, making the cavity 34 impervious to liquid or air.

The assembly procedure for the integrated-circuit cooling apparatus may be performed sequentially as described above or may be done in a single step. It is apparent that the fabrication process is simpler, and therefore more economical and efficient, than the systems of the prior art. While the invention has been described with reference to a single semiconductor die, it will be understood that the invention includes multi-chip applications, wherein many semiconductor chip assemblies are interconnected and cooperatively cooled. For instance, a plurality of semiconductor chips may be positioned within the perimeter of a single dike, permitting a cooling liquid to sequentially circulate among many chips within a single package.

Figure 4:
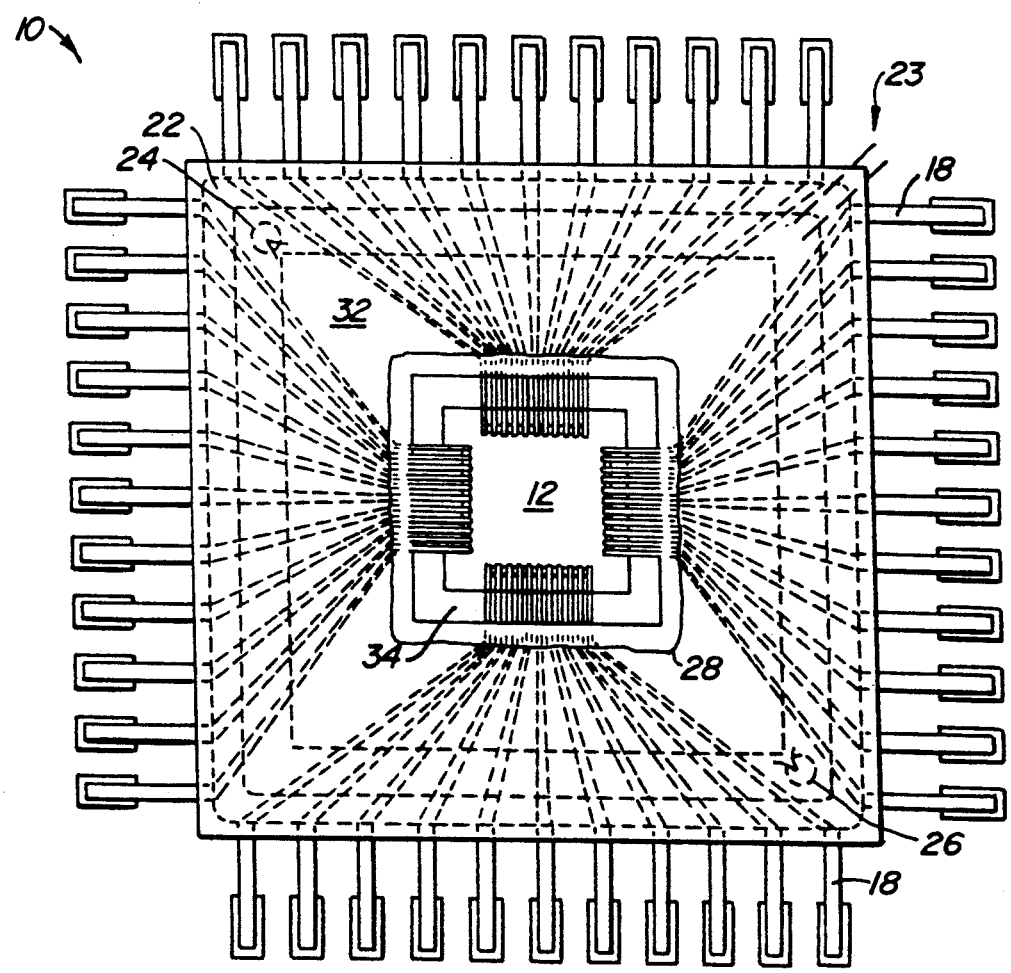
FIG. 4 is a plan view of the apparatus as shown in FIG. 1.

FIG. 4 is a top plan view of an integrated-circuit cooling apparatus 10. The apparatus shown in this figure has more leads 18 than the apparatus shown in FIG. 1, but is the essentially the same otherwise. Note that the input/output ports 24, 26 are positioned between the dike 22 and the heat spreader 32 to maximize the amount of surface area upon which the liquid coolant is circulated. The input port 24 and output port 26 may be positioned at opposing ends of the die 12, or may alternatively be positioned near each other. If the ports are close to each other, a manifold current divider (not shown) could be used to control the flow of the liquid coolant. As discussed above, it is important to ensure an even flow of liquid coolant so that the temperature of the die is equal on all surfaces. The input/output ports may therefore be positioned as described to ensure that the coolant circulates evenly throughout the cavity 34. Positioning of the input/output ports also depends on the fluid flow rates, the power used by the die, and the particular cooling fluid used. Alternately, the dike may includes a bore 23. In this arrangement, the cooling fluid would enter and exit the bores via external hoses connected to the bores and positioned between the leads 18. The effect of the cooling liquid is an improvement over the prior art because the semiconductor die 12 is directly contacted by the cooling liquid, thereby improving cooling efficiency, but not affecting the electrical connections to the die.

After reading and understanding the foregoing inventive integrated-circuit cooling apparatus, in conjunction with the drawings, it will be appreciated that several distinct advantages of the subject invention are obtained. Without attempting to set forth all of the desirable features of the instant invention, at least some of the major advantageous features of the invention include the use of heat spreader, which increases the amount of heat surface area contacted by the cooling fluid. Since the semiconductor die 12 is directly contacted by the cooling liquid, the transfer of heat from the die to the liquid is optimal. The dike 22 is simple to fabricate and reliably contains the cooling fluid within the cavity 34. The locations of the input port 24 and output port 26 insure that there is uniform flow of the cooling liquid. The configuration is also space effective because the height of the entire package above the printed circuit board does not increase in comparison to TAB packages which do not include the cooling feature of the present invention. The integrated-circuit cooling apparatus is simple and inexpensive, compact, and may be conveniently used in conjunction with a TAB-packaged semiconductor chip.

It should be noted that although the invention has been described with reference to specific embodiments, it should not be construed to be so limited. For example, while the use of a heat spreader is advantageous, it is not essential for the invention. The input and output ports may also be connected to cavity 34 in a manner different from those shown. Those skilled in the art and familiar with the instant disclosure of the subject invention may recognize additions, deletions, modifications, substitutions and other changes which will fall within the purview of the subject invention and claims.

What is claimed is:

1. An integrated-circuit cooling apparatus, said apparatus comprising:

a semiconductor die having bond pads fabricated thereon, said semiconductor die being connected to a tape having leads fabricated thereon, said tape being positioned next to said semiconductor die to permit electrical connections between said leads and said bond pads on said semiconductor die;

a support structure having a surface for supporting said semiconductor die;

a dike connected to said surface and said tape, said dike forming a cavity with said tape, said surface, and a portion of said semiconductor die;

input means and output means connected to said cavity; and means for cooling said semiconductor die, said cooling means including a cooling fluid and means for circulating said cooling fluid throughout said cavity and utilizing said input means and said output means to reduce the temperature of said semiconductor die and said support structure during operation of said semiconductor die by causing said cooling fluid to directly contact said portion of said semiconductor die, at least a portion of said leads on said tape, and at least a portion of said surface for supporting said semiconductor die.

2. The integrated-circuit cooling apparatus as claimed in claim 1 wherein said input means and said output means are respectively an input port and an output port.

3. The integrated-circuit cooling apparatus as claimed in claim 2 wherein said input port and said output port are fabricated through said surface, said ports being in communication with said cavity.

4. The integrated-circuit cooling apparatus as claimed in claim 1 and further including heat spreading means for distributing heat emitted from said die, said heat spreading means being connected to said semiconductor die to permit heat transfer between said heat spreading means and said die.

5. The integrated-circuit cooling apparatus as claimed in claim 4 wherein said heat spreading means is composed of a heat conducting material.

6. The integrated-circuit cooling apparatus as claimed in claim 4 wherein said heat spreading means further comprises a plate having a surface area which is larger than the surface area of said semiconductor die.

7. The integrated-circuit cooling apparatus as claimed in claim 1 wherein said support structure comprises a printed circuit board.

8. The integrated-circuit cooling apparatus as claimed in claim 1 wherein said cooling fluid includes water.

9. The integrated-circuit cooling apparatus as claimed in claim 1 wherein said dike is composed of a heat insulating material.

10. The integrated-circuit cooling apparatus as claimed in claim 1 wherein said dike is connected to said tape by means of a flexible thermoplastic glue.

11. The integrated-circuit cooling apparatus as claimed in claim 7 wherein said printed circuit board comprises a flexible printed circuit board.

12. The integrated-circuit cooling apparatus as claimed in claim 1, said apparatus further comprising a plurality of semiconductor dies supported by said surface and connected to said tape, such that said dike forms a cavity with said tape, said surface, and portions of said plurality of semiconductor dies to permit cooling of said plurality of semiconductor dies.

13. The integrated-circuit cooling apparatus as claimed in claim 1 wherein said cooling fluid includes freon and other fluoroinerts.

14. The integrated circuit cooling apparatus as recited in claim 1, said tape having an opening adjacent to said semiconductor die, further comprising an encapsulant placed over said opening such that said encapsulant covers and seals said opening.

15. The integrated circuit cooling apparatus as recited in claim 2 wherein said input port is fabricated through said dike, said input port being in communication with said cavity.

16. The integrated circuit cooling apparatus as recited in claim 2 wherein said output port is fabricated through said dike, said output port being in communication with said cavity.

* * * * *